United States Patent
Frey (10) Patent No.: US 7,208,851 B2
(45) Date of Patent: Apr. 24, 2007

(54) CIRCUIT ARRANGEMENT FOR THE RELIABLE SWITCHING OF ELECTRICAL CIRCUITS

(75) Inventor: Fritz Frey, Kuenzelsau (DE)

(73) Assignee: Wurth Elektronik eiSos Gmbh & Co., KG, Waldenburg (DE)

( * ) Notice: Subject to any disclaimer, the term of this patent is extended or adjusted under 35 U.S.C. 154(b) by 0 days.

(21) Appl. No.: 10/496,097

(22) PCT Filed: Nov. 19, 2002

(86) PCT No.: PCT/EP02/12956

§ 371 (c)(1),
(2), (4) Date: Oct. 12, 2004

(87) PCT Pub. No.: WO03/044954

PCT Pub. Date: May 30, 2003

(65) Prior Publication Data

US 2005/0062574 A1    Mar. 24, 2005

(30) Foreign Application Priority Data

Nov. 20, 2001   (DE) ................................ 101 56 963

(51) Int. Cl.
| | |
|---|---|
| *H01J 19/64* | (2006.01) |
| *H01J 31/10* | (2006.01) |
| *H01J 33/52* | (2006.01) |
| *H01J 33/59* | (2006.01) |
| *H01J 47/00* | (2006.01) |
| *H01J 85/46* | (2006.01) |
| *H02B 1/24* | (2006.01) |

(52) U.S. Cl. .................................................... 307/113
(58) Field of Classification Search ................. 307/113
See application file for complete search history.

(56) References Cited

U.S. PATENT DOCUMENTS

| 3,699,358 | A | | 10/1972 | Wilkinson |
| 5,591,993 | A | | 1/1997 | Nomura et al. |
| 5,932,995 | A | * | 8/1999 | Wagoner ..................... 323/222 |
| 6,038,142 | A | * | 3/2000 | Fraidlin et al. .............. 363/17 |

(Continued)

FOREIGN PATENT DOCUMENTS

DE    35 13 675 A1    4/1985

(Continued)

OTHER PUBLICATIONS

Pit-Leong Wong, Performance Improvements of Multi-Channel Interleaving Voltage Regulator Modules with Integrated Coupling Inductors, Mar. 28, 2001, Blacksburg, Virginia, pp. i-204.

(Continued)

*Primary Examiner*—Chau N. Nguyen
*Assistant Examiner*—Carlos Amaya
(74) *Attorney, Agent, or Firm*—Quarles & Brady LLP (57) ABSTRACT

A circuit arrangement for the reliable switching of electrical circuits contains two series paths, two switching elements being arranged in parallel with one another in one of the series paths, the switching inputs of said switching elements being connected to the input point of the series path and the switching outputs of said switching elements being connected to the input side of a respective winding of a transformer.

46 Claims, 6 Drawing Sheets

U.S. PATENT DOCUMENTS 6,084,790 A 7/2000 Wong

FOREIGN PATENT DOCUMENTS

| DE | 43 16 816 A1 | 11/1994 |
| DE | 198 04 623 A1 | 1/1999 |
| GB | 1 553 814 A | 10/1979 |
| WO | WO 01/80425 A1 | 4/2001 |

OTHER PUBLICATIONS

"Low-Inductance Wiring for Parallel Switiching Transistors", NTIS Tech Notes, US Department of Commerce, Springfield, VA, Feb. 1, 1991, p. 134, XP000224748.

* cited by examiner

CIRCUIT ARRANGEMENT FOR THE RELIABLE SWITCHING OF ELECTRICAL CIRCUITS

BACKGROUND OF THE INVENTION

For interrupting and making electrical circuits, use is made both of mechanical contacts, sliding contacts such as in the case of current collectors on rail vehicles or commutators in electric motors, fusible links, and of semiconductor switches such as transistors, thyristors and semiconductor relays.

During interruption of the electrical circuits, all these switching elements are exposed to a high self-induced voltage as a result of the rapid reduction of the energy stored inductively in the entire electrical circuit.

Said self-induced voltage heats and destroys semiconductor switching elements and protective circuits, causes material migration and welding at contact areas and can prevent the breaking of the electrical circuit as a result of arcing between contact areas.

During making of an electrical circuit, the capacitance present in the circuit has to be charged rapidly, which momentarily leads to a large switch-on current.

Said switch-on current brings about material migrations at contact areas that have not yet completely closed, and can destroy semiconductor switches through local thermal overloading.

During the transition of the switching elements from the conducting to the blocking state and from the blocking to the conducting state, a power loss is produced at the switching elements due to the simultaneous presence of current and voltage, said power loss being referred to as switching power.

In the case of frequent switching operations, this switching power leads to the heating of the switching elements and of adjacent components, and thereby jeopardizes the reliable operation of entire apparatuses and installation.

In order to protect the switching elements from the harmful effects of the self-induced voltage, use is made of RC circuits, but the latter are heated greatly in the event of high switching frequency.

Diode circuits, also known as freewheeling diodes, protect the switching elements from self-induced voltage only after a response time, but cannot be used with AC voltage, and cause a power loss during each switching operation, which limits the efficiency of frequently switching circuit arrangements such as voltage converters or switched-mode power supplies and leads to the heating and damage thereof.

Furthermore, varistor circuits are known, which protect the switch from particularly high self-induced voltages. However, said varistors are rapidly heated and are therefore unsuitable in the event of high switching frequency and high voltage and also for precise limiting of the overvoltages to low values, for the protection of semiconductor components.

It is also known that the self-induced voltage and heating of the switching element during interruption of the electrical circuit can be effectively limited by means of capacitor connected in parallel with the load or else in parallel with the switching element. However, this circuit has the disadvantage that, during the closing of the switching element, the capacitor would have to be short-circuited or abruptly charged, which causes very high switch-on currents, high switching losses and severe wear of the switching elements, so that the capacitance of the capacitor remains limited to a very small value and the effectiveness thereof is thus greatly restricted.

Taking this as a departure point, it is an object of the invention to specify a circuit arrangement which enables the reliable switching of electrical circuits.

SUMMARY OF THE INVENTION

The circuit arrangement according to the invention prevents the occurrence of high self-induced voltage by means of a capacitor which momentarily accepts the current from the electrical load circuit to be broken and, by means of its discharge operation, prevents a rapid rise of the voltage across the windings of the transformer and the opening switching elements connected in series therewith.

The—according to the invention—reliable switch-off operation of current-carrying switching elements is in this case achieved by avoiding voltage spikes, power loss and heating.

Avoiding power loss during the switch-off operation according to the invention also prevents the production of arcs in the case of electromechanical switching elements and fusible links and thus enables the latter to be reliably switched off according to the invention.

If large quantities of energy are present in the electrical load circuit, the circuit arrangement according to the invention may be configured such that the load is short-circuited after disconnection from the voltage source and the energy is held in the electrical load circuit.

During making of an electrical circuit, the load is connected to the voltage source by the circuit arrangement according to the invention via a transformer winding acting as an inductance, which brings about a slow controlled current rise and a slow controlled charging of the capacitance in the electrical load circuit. The slow controlled current rise and the small power loss in the switching element when the load current is switched on via an inductance enables an—according to the invention—reliable closing operation of the switching elements.

The voltage at the transformer winding is transformed to a second winding, which, when the capacitance in the electrical load circuit is charged to the voltage of the voltage source, brings a second switching element into a voltageless state in which it can be reliably closed according to the invention, with little power loss.

Since the circuit arrangement according to the invention enables the reliable switching operations substantially by avoiding power loss, the invention can make a significant contribution to miniaturization and reduction of costs for frequently switching apparatuses such as DC voltage converters, switched-mode power supplies, motor drives, since it permits significantly higher switching frequencies.

Reducing the power loss during switching operations also makes an important contribution to environmental protection.

Since the circuit arrangement according to the invention uses only one transformer and a usually very small capacitor for limiting damaging voltages and damaging rapid current rises, the circuit arrangement can be used for DC voltages and sinusoidal or rectangular AC voltages.

BRIEF DESCRIPTION OF THE DRAWINGS

Exemplary embodiments of the invention are illustrated in the drawing and are described in more detail below.

In the figures.

DETAILED DESCRIPTION

Figure 1:
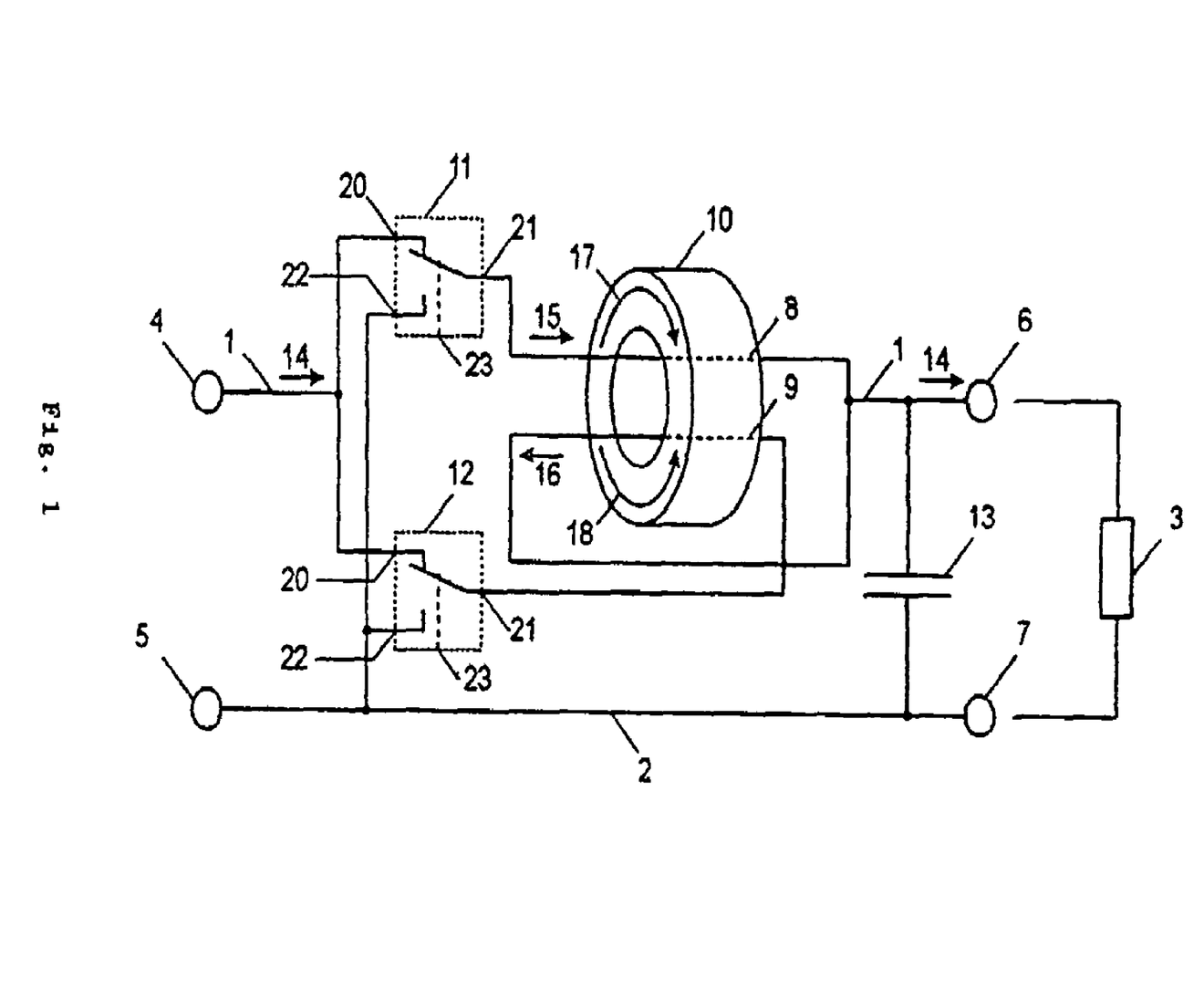
FIG. 1 shows a first exemplary embodiment of the circuit arrangement according to the invention.

The circuit arrangement according to the invention has two series paths 1 and 2, which are located in the lead to the load 3 and contain two connecting points 4 and 5 for the connection of the voltage source, and also two connecting points 6 and 7 for the connection of the load 3.

The series path 1 is subdivided into two further series paths containing in each case a winding 8 and 9 of the transformer 10 and also in each case a switching element 11 and 12, respectively.

Downstream of the transformer 10, the two windings 8 and 9 are connected to one another and to the connecting point 6.

A capacitor 13 is connected in parallel with the load between the series paths 1 and 2. The capacitor 13 may be chosen to be very large in the case of slowly switching circuit arrangements or high load currents, and, in the case of rapidly switching circuit arrangements, be so small that the line capacitance between 1 and 2 suffices for obtaining the desired protective effect.

The load current 14 from series path 1 is divided into the component currents 15 and 16 such that the magnetic field strengths 17 and 18 thereof in the core of the transformer 10 act oppositely to one another and mutually compensate for one another.

If the two component currents 15 and 16 in the windings 8 and 9 are of the same magnitude, the load current 14 cannot store energy in the transformer core.

If the component current 15 is interrupted by the switching element 11, then its compensating field strength 17 is omitted, as a result of which the remaining current-carrying winding 9 takes effect as an inductance and momentarily interrupts the remaining component current 16 since the transformer core is not yet magnetized. Therefore, immediately after the interruption of the component current 15, the load current 14 is drawn completely from the capacitor 13, so that the remaining, second switching element 12, according to the invention, can be reliably opened in a virtually currentless and voltageless state with little power loss.

The capacitor 13 is discharged by the load current 14 after the opening of switching element 11, as a result of which the capacitor voltage falls, and a voltage is produced across the transformer winding 9, which is transformed to the transformer winding 8. The voltage in transformer winding 8, together with the voltage across capacitor 13, has the effect that the switching element 11, according to the invention, can open reliably in a virtually voltageless state, with very little power loss.

Figure 3:
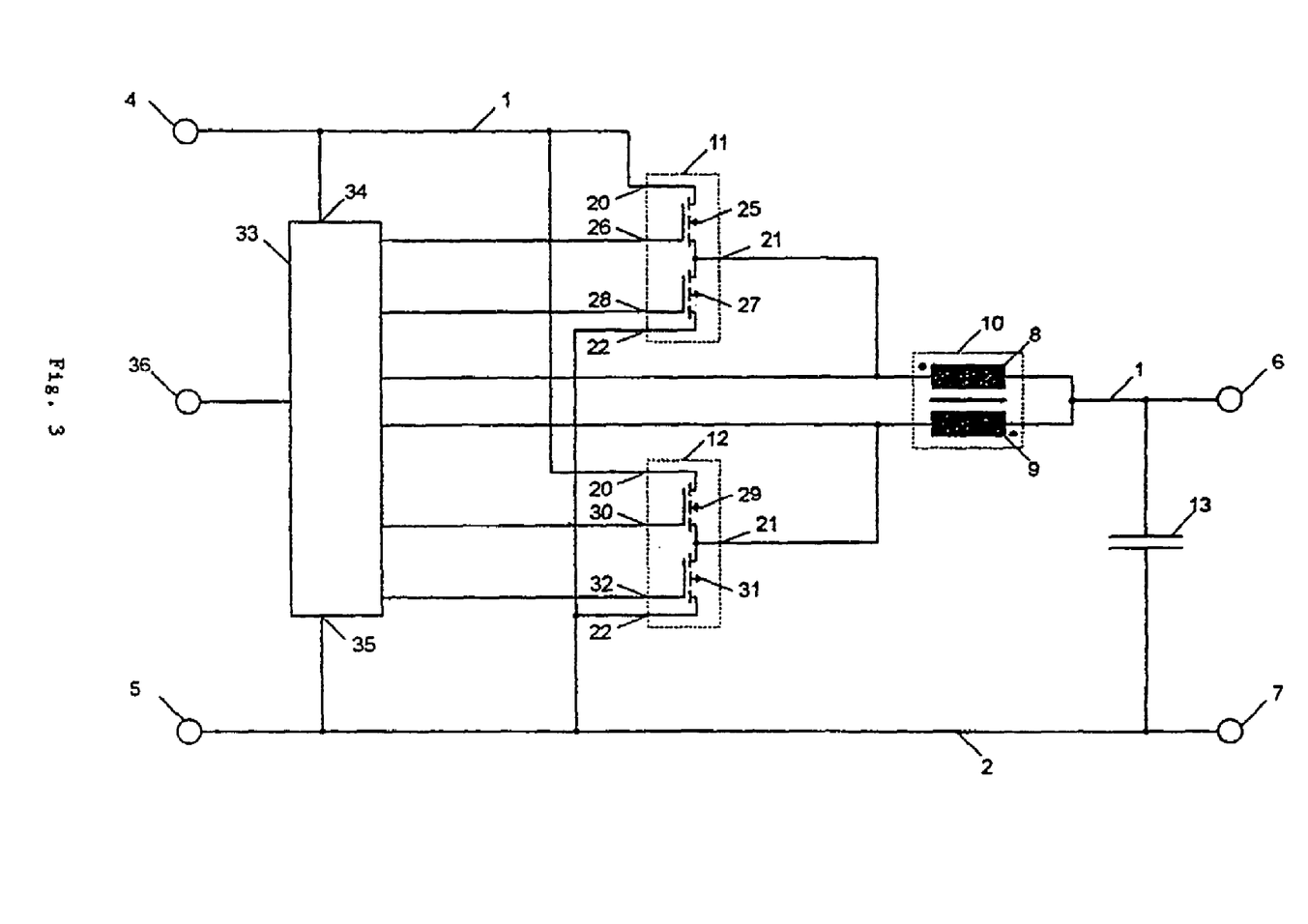
FIG. 3 shows an example with transistors and control device 33.

In the simplest case, the switching elements 11 and 12 may comprise a switching contact, a fusible link or a transistor, which undergo transition to the nonconducting state simultaneously, or with a short delay, when the electrical circuit is interrupted. The switching elements 11 and 12 may also be formed as changeover contacts, push-pull or CMOS transistor stages which, after the disconnection of the series path 1 from the connecting point of the voltage source 4, establish a connection to the series path 2 in order to conduct away the load current 14 and to hold the energy stored in the load 3 in the electrical load circuit.

In order to conduct away the energy stored in the electrical circuit, the switching elements 11 and 12 may also be provided with diodes which conduct away the load current 14 after the disconnection from the voltage source to the series path 2.

A further possibility is to measure the voltage across the switching elements by means of a voltage measuring device and to establish the connection to the series path 2 with a controllable switching element when the measured voltage has become zero, thereby achieving an—according to the invention—reliable, low-loss closing operation in a voltageless state.

The load can be connected to the voltage source again by only one or both switching elements 11 and 12 interrupting the connection to the series path 2, and then only one switching element connecting the corresponding transformer winding to the series path 1, so that the capacitor 13 is charged via the winding inductance of the transformer 10. In this case, according to the invention, the winding inductance prevents a rapid rise of the charging current and thus enables, according to the invention, the reliable, low-loss closing of the switching element in a virtually currentless state. If the capacitor 13 is completely charged, the second switching element may likewise establish the connection to the voltage source in low-loss fashion in a virtually voltageless state reliably, according to the invention, whereupon the component currents 15 and 16 in the windings of the transformer match one another.

Figure 2:
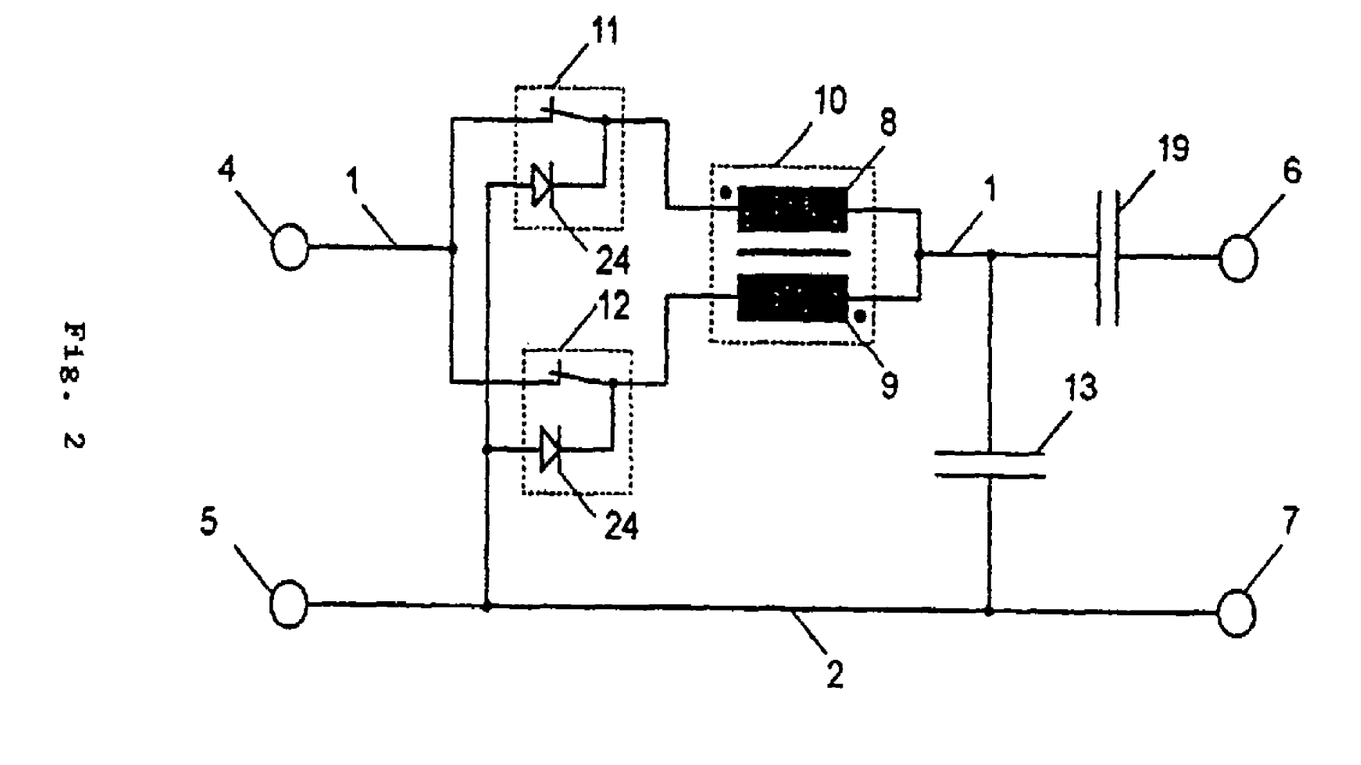
FIG. 2 shows an example of alternating current direction in the load.

A further embodiment of the circuit according to the invention consists in the fact that the load 3 is connected to the series path 1 or 2 via a capacitor 19 connected in series. This results in an alternating current direction in the load, which permits the capacitor 13 to be charged to the voltage of the voltage source by the load current in the event of switch-on. The two switching elements 11 and 12 can then establish the connection to the voltage source in a currentless and voltageless state without energy being fed into the transformer 10.

Figure 4:
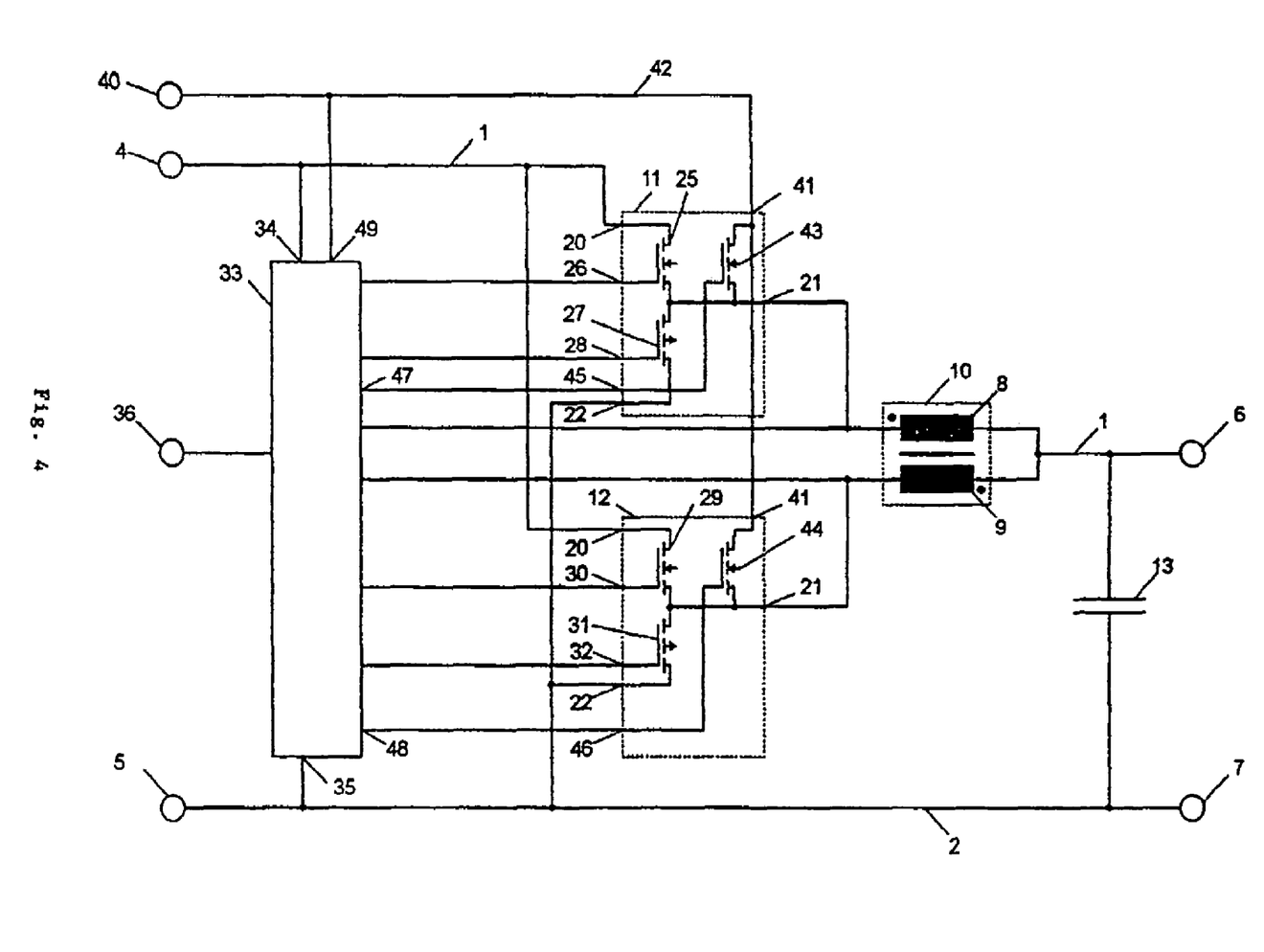
FIG. 4 shows an example of the operation of the circuit arrangement according to the invention from two voltage sources.

The circuit according to the invention may likewise be used on voltage sources of alternating polarity for rectifying the current and for regulating the power drawn from the voltage source. In this case, at the beginning of the positive half-cycle, the transformer 10 is connected to the voltage source by the switching elements 11 and 12 via the series path 1 and, during the positive half-cycle, after a time period determined by a suitable regulating device, is again connected to the neutral conductor of the voltage source, series path 2, in order to generate a positive rectified current for the load. At the beginning of the negative half-cycle, the transformer 10 is connected to the voltage source by the switching elements 11 and 12 via the series path 1 and, during the negative half-cycle, after a time period determined by a suitable regulating device, is again connected to the neutral conductor of the voltage source, series path 2, in order to generate a negative rectified current for the load.

Figure 5:
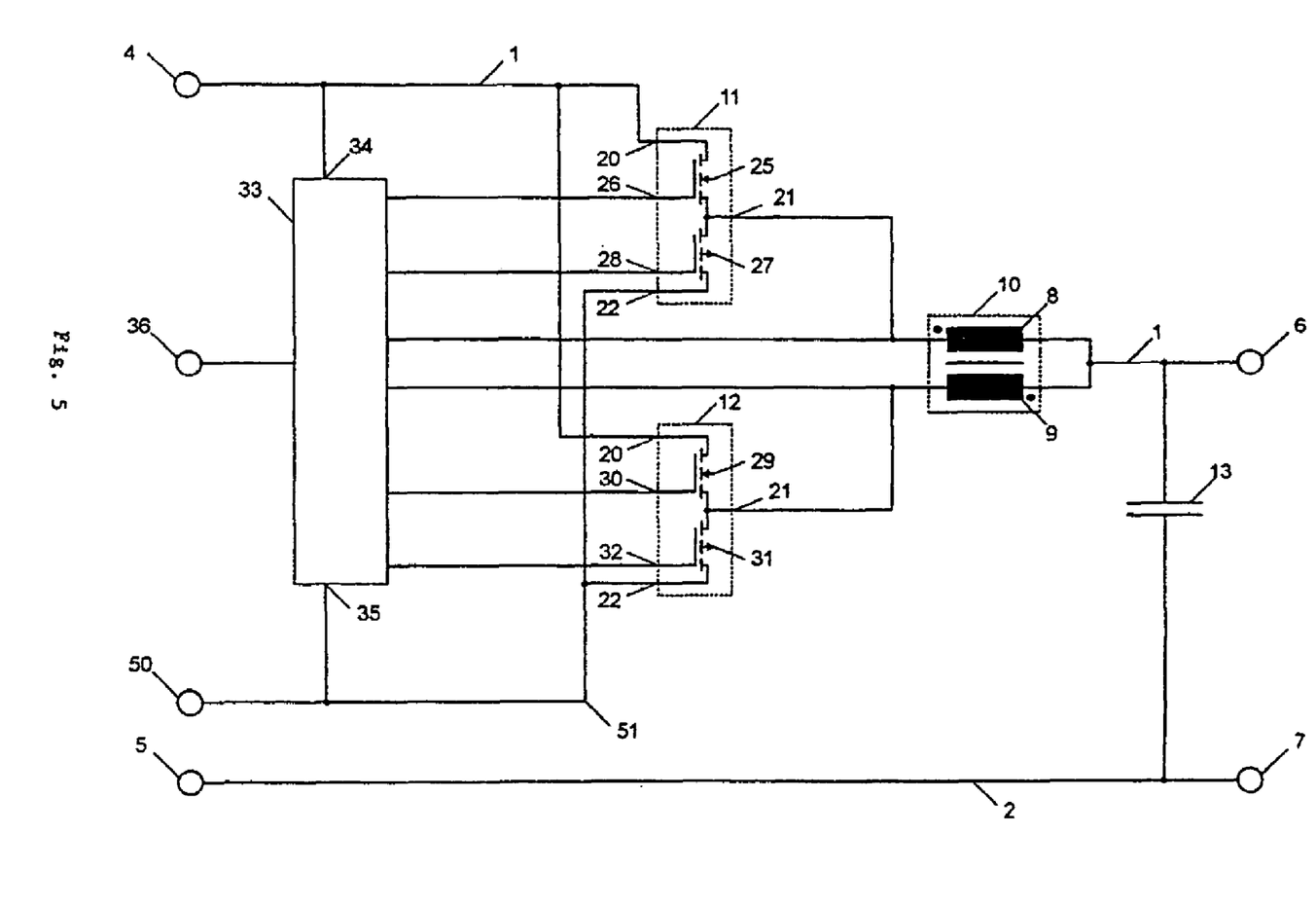
FIG. 5 shows an example of the operation of the circuit arrangement according to the invention from one AC voltage source formed from a transformer winding with a center tap.

The circuit according to the invention may furthermore be used on voltage sources of alternating polarity with a neutral conductor, such as, for example, the secondary winding of a transformer with a center tap, for rectifying the current and for regulating the power drawn from the voltage source. In this case, at the beginning of the positive half-cycle, the transformer 10 remains connected by the switching elements 11 and 12 to the—at this point in time—positive terminal of the voltage source, and, during the positive half-cycle, at a switching instant determined by a suitable regulating device, is connected via the switching elements 11 and 12 to the—at this point in time—negative terminal of the voltage source. This connection persists to the end of this half-cycle, and through the polarity reversal of the voltage source right into the next half-cycle. In this way, by defining the switching instant, it is possible for the load to be fed a positive current if the switching instant lies in the second half of the half-cycle, a negative current if the switching instant lies in the first half of the half-cycle, and no current if the switching instant lies in the center of the half-cycle.

FIG. 6 shows the possibility of how the circuit described in the application can be used as an active impedance. It can thereby be used very simply as a replacement for an ohmic resistor for current limiting. In this case, the circuit is completely encapsulated and, like a simple impedance, provided only with two terminals. One path is thus not connected.

The circuit may acquire an ohmic characteristic, be embodied as a voltage source or current source, or operate with an additional control input as a potentiometer or power controller, an extremely low power loss occurring in each case.

Figure 6A:
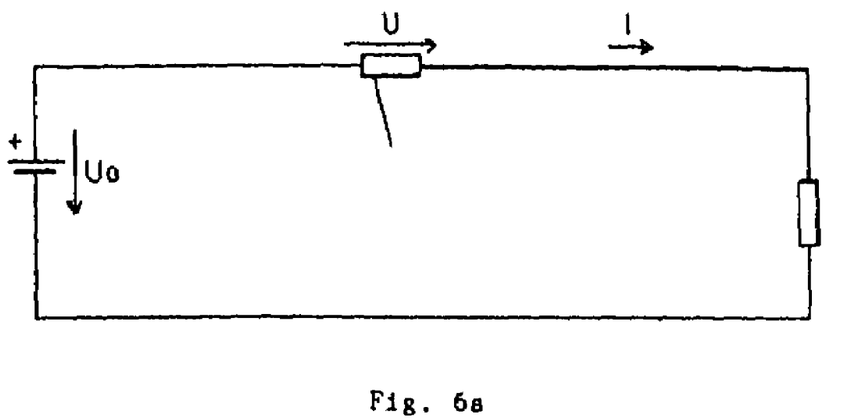
FIG. 6 shows an exemplary application of the circuit arrangement according to the invention.
Figure 6B:
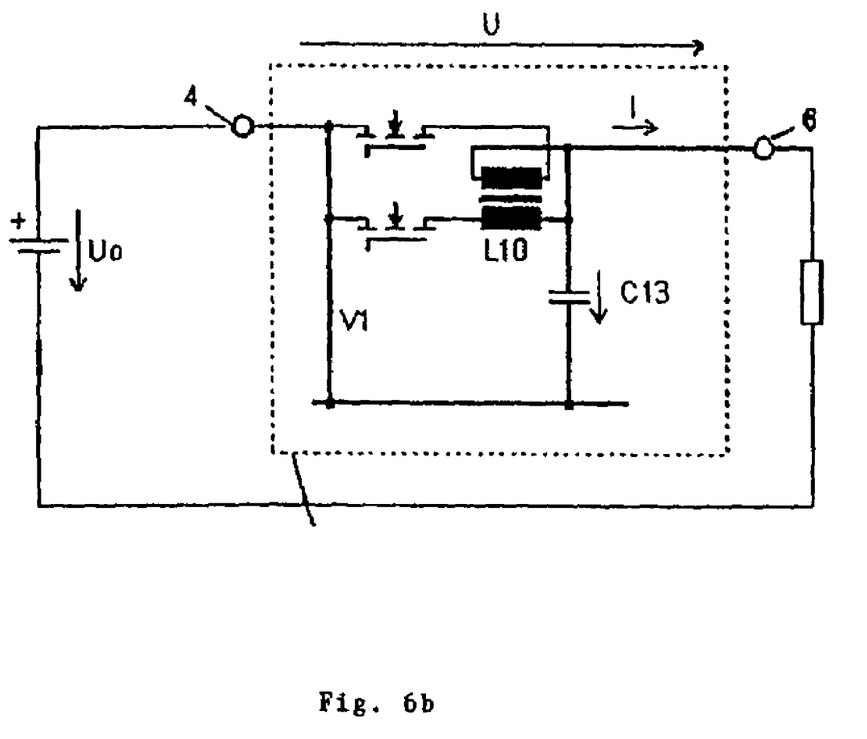

In the case of the circuit illustrated in FIG. 6b, the power loss amounts to only approximately 0.05*U*I, that is to say approximately 5 percent of the power loss which would occur at the ohmic resistor of FIG. 6a. The value of the impedance is dependent on the value of the inductance L 10 and the capacitance C 13.

Subclaims relate to further refinements of the invention. In this case, such feature combinations for which no express example has been specified are also to be regarded as claimed.

The invention claimed is:

1. A circuit arrangement for the reliable switching of electrical circuits, in a lead to a current load (3), comprising a first series path (1, 2), which electrically connects a first input point (4, 5) to a first output point (6, 7), and a second series path (1,2) which electrically connects a second input point (4, 5) to a second output point (6, 7), characterized in that at least two switching elements (11, 12) are arranged in parallel with one another in at least one of the series paths (1, 2), the switching inputs (20) of said switching elements being connected to the input point of the series path (4, 5) and the the switching outputs (21) of said switching elements being connected to the input side of a respective winding (8, 9) of a transformer (10), and the output sides of the windings (8, 9) are connected to one another and to the output point of the series path (6, 7), and the windings of the transformer are embodied such that the magnetic field strengths (17, 18) of the two component currents (15, 16) of the load current (14) in the transformer (10) act oppositely to one another, and a capacitance (13) is connected across the output points (6, 7) of the series paths (1, 2) to be charged after the switching elements (11, 12) are closed, and then discharged when one of the switching elements (11, 12) is opened to provide current to a load and to allow opening of the switching elements in a low-voltage, low-current state.

2. The circuit arrangement as claimed in claim 1, characterized in that a another capacitor (19) is arranged in series with the load in at least one of the series paths (1, 2).

3. The circuit arrangement as claimed in claim 1 or 2, characterized in that at least one of the switching elements (11, 12) has a control input (23) which, when actuated, interrupts the connection between the switching input (20) and the switching output (21).

4. The circuit arrangement as claimed in claim 3, characterized in that at least one of the switching elements (11, 12) has a further input (22), which is conductively connected to the series path (1, 2), and contains at least one nonlinear element (24) located between the input (22) and the switching output (21).

5. The circuit arrangement as claimed in claim 4, characterized in that the nonlinear element (24) becomes conductive if the polarity of the voltage at the switching output (21) becomes opposite to the polarity at the switching input (20).

6. The circuit arrangement as claimed in claim 4, characterized in that the nonlinear element (24) becomes conductive if the polarity of the voltage at the switching output (21) exceeds the magnitude of the voltage at the switching input (20).

7. The circuit arrangement as claimed in claim 3, characterized in that the control inputs (23) of the switching elements (11, 12) are actuated virtually simultaneously by a suitable device.

8. The circuit arrangement as claimed in claim 7, characterized in that the control inputs (23) of the switching elements (11, 12) are connected to one another and are actuated virtually simultaneously by at least one suitable device.

9. The circuit arrangement as claimed in claim 1 or 2, characterized in that at least one of the switching elements (11, 12) has a control input (23) which, when actuated interrupts the connection between the switching input (20) and switching output (21), and establishes the connection to a further switching input (22), which is conductively connected to the series path (1, 2).

10. The circuit arrangement as claimed in claim 9, characterized in that the control inputs (23) of the switching elements (11, 12) are connected to one another and are actuated virtually simultaneously by at least one suitable device.

11. The circuit arrangement as claimed in claim 1 or 2, characterized in that at least one of the switching elements (11, 12) contains a controllable component (25, 29) with a control input (26, 30), which can establish and interrupt the connection between the switching input (20) and the switching output (21) of the switching elements.

12. The circuit arrangement as claimed in claim 11, characterized in that the controllable component comprises at least one relay contact.

13. The circuit arrangement as claimed in claim 11, characterized in that the controllable component comprises at least one transistor.

14. The circuit arrangement as claimed in claim 11, characterized in that the controllable component comprises at least one thyristor.

15. The circuit arrangement as claimed in claim 1 or 2, characterized in that at least one of the switching elements (11, 12) contains a controllable component (27, 31) with a control input (28, 32), which can establish and interrupt the connection between the switching input (22) and the switching output (21) of the switching elements.

16. The circuit arrangement as claimed in claim 1 or 2, characterized in that at least one of the switching elements (11, 12) contains two controllable components (25, 27) and (29, 31) each with a control input (26, 28) and (30, 32), respectively, which can establish and interrupt the connection between the switching inputs (20) and the switching outputs (21) and also between the switching inputs (22) and the switching outputs (21).

17. The circuit arrangement as claimed in claim 16, characterized in that the control inputs (26, 28, 30, 32) of the components (25, 27, 29, 31) are led to a control device (33), which can assume at least two states, state 1 and state 2, and which has at least one control input (36).

18. The circuit arrangement as claimed in claim 17, characterized in that the control device (33) in state 1 drives the components (25, 29) such that the latter conductively connect the switching inputs (20) to the switching outputs (21) of the switching elements (11, 12), and drives the components (27, 31) such that the latter interrupt the connection between the switching inputs (22) and the switching outputs (21) of the switching elements (11, 12).

19. The circuit arrangement as claimed in claim 18, characterized in that the control device (33), upon the transition from state 2 to state 1, then drives the components (25, 29) such that they establish a conductive connection between switching input (20) and switching output (21) if the voltage between switching input (20) and switching output (21) has become virtually zero.

20. The circuit arrangement as claimed in claim 18, characterized in that the control device (33), upon the transition from state 1 to state 2, then drives the components (27, 31) such that they establish a conductive connection between switching input (22) and switching output (21) if the voltage between switching input (22) and switching output (21) has become virtually zero.

21. The circuit arrangement as claimed in claim 17, characterized in that the control device (33) in state 2 drives the components (25, 29) such that the latter interrupt the connections between the switching inputs (20) and the switching outputs (21) of the switching elements (11, 12), and drives the components (27, 31) such that the latter establish the conductive connection between the switching inputs (22) and the switching outputs (21) of the switching elements (11, 12).

22. The circuit arrangement as claimed in claim 17, characterized in that the control device (33) is changed over from state 1 to state 2 via the control input (36), and the control device (33), upon this state transition, drives the components (25, 29) virtually simultaneously such that the connection between switching inputs (20) and the switching outputs (21) is interrupted, subsequently drives one of the components (27) or (31) such that the connection between the switching input (22) and the switching output (21) thereof is established, and then drives the second component (27) or (31) via the control input (28) or (32) thereof such that the connection between the switching input (22) and switching output (21) thereof becomes conductive if the voltage between the switching input (22) and switching output (21) thereof has become virtually zero.

23. The circuit arrangement as claimed in claim 22, characterized in that the transition from state 2 to state 1 in the switching device (33) is triggered by the control input (34) or (35) when the voltage between input point (4) and input point (5) becomes positive, and the transition from state 1 to state 2 is triggered by the control input (36).

24. The circuit arrangement as claimed in claim 22, characterized in that the transition from state 2 to state 1 in the switching, device (33) is triggered by the control input (34) or (35) when the voltage between input point (4) and input point (5) becomes negative, and the transition from state 1 to state 2 is triggered by the control input (36).

25. The circuit arrangement as claimed in claim 17, characterized in that the control device (33) is changed over from state 2 to state 1 via the control input (36), and, upon this state transition, drives the components (27, 31) virtually simultaneously such that the connection between the switching inputs (22) and the switching outputs (21) is interrupted, subsequently drives one of the components (25) or (29) such that the connection between the switching input (20) and the switching output (21) thereof is established, and then drives the second component (25) or (29) via the control input (26) or (30) thereof such that the connection between the switching input (20) and the switching output (21) thereof has become virtually zero.

26. The circuit arrangement as claimed in claim 17, characterized in that the control device (33) is changed over from state 1 to state 2 via the control input (36), and, upon this state transition, drives the components (25, 29) virtually simultaneously such that the connection between the switching inputs (20) and the switching outputs (21) is interrupted, subsequently then drives one of the components (27) or (31) such that the connection between the switching input (22) and switching output (21) thereof is established if the voltage between switching input (22) and switching output (21) has become virtually zero, and then drives the second component (27) or (31) via the control input (28) or (32) thereof such that the connection between the switching input (22) and switching output (21) thereof becomes conductive if the voltage between the switching input (22) and the switching output (21) thereof has become virtually zero.

27. The circuit arrangement as claimed in claim 17, characterized in that the control device (33) is changed over from state 2 to state 1 via the control input (36), and, upon this state transition, drives the components (27, 31) virtually simultaneously such that the connection between the switching inputs (22) and the switching outputs (21) is interrupted, subsequently then drives one of the components (25) or (29) such that the connection between the switching input (20) and switching output (21) has become virtually zero, and then drives the second component (25) or (29) via the control input (26) or (30) thereof such that the connection between the switching input (20) and the switching output (21) thereof becomes conductive if the voltage between the switching input (20) and the switching output (21) thereof has become virtually zero.

28. The circuit arrangement as claimed in claim 17, characterized in that a voltage source having alternating polarity, such as, for example, a main voltage, the secondary winding of a transformer, the secondary winding of a switched-mode power supply transformer, is connected to the input points (4, 5).

29. The circuit arrangement claimed in claim 28, characterized in that the control device (33) has a further control input (34) connected to the series path (1).

30. The circuit arrangement as claimed in claim 28, characterized in that the control device (33) has a further control input (35) connected to the series path (2).

31. The circuit arrangement as claimed in claim 28, characterized in that a second voltage source having alternating polarity, such as, for example, a mains voltage, the secondary winding of a transformer, or the secondary winding of a switched-mode power supply transformer, is connected to input point (5) and to a further input point (40) such that the input point (40) has the opposite polarity to the input point (4).

32. The circuit arrangement as claimed in claim 31, characterized in that the switching elements (11, 12) in each case have a further switching input (41), which is connected to the input point (40) via a further series path (42), and in each case have at least one further controllable component (43, 44) with the control inputs (45, 46), which controllable component can be driven such that it establishes a conductive connection between switching input (41) and switching output (21).

33. The circuit arrangement as claimed in claim 32, characterized in that the control devices (33) is connected to the control input (45) of the component (43) via a further control output (47), to the control input (46) of the component (44) via a further control output (48) and to the series path (42) via a further input (49).

34. The circuit arrangement as claimed in claim 33, characterized in that the control device (33), during the rise of the input voltage (4, 5), drives the components (25, 27, 29, 31) such that the switching inputs (20) are conductively connected to the switching outputs (21) and the conductive connection between the switching inputs (22) and the switching outputs (21) is interrupted, and, during the rise of the input voltage (40, 5), drives the components (27, 31, 43, 44) such that the switching inputs (41) are conductively connected to the switching outputs (21), and the conductive connection between the switching inputs (22) and the switching outputs (21) is interrupted, and, by means of a suitable signal of the control input (36) of the control device (33), the components (25, 29, 43, 44) are driven such that the conductive connections between switching inputs (20, 41) and the switching output (21) are interrupted, and the components (27, 31) are driven such that a conductive connection is produced between the switching inputs (22) and the switching outputs (21).

35. The circuit arrangement as claimed in claim 33, characterized in that the control device (33), during the fall of the input voltage (4, 5), drives the components (25, 27, 29, 31) such that the switching inputs (20) are conductively connected ot he switching outputs (21) and the conductive connection between the switching inputs (22) and the switching outputs (21) is interrupted, and, during the fall of the input voltage (40, 5), drives the components (27, 31, 43, 44) such that the switching inputs (41) are conductively connected to the switching outputs (21), and the conductive connection between the switching inputs (22) and the switching outputs (21) is interrupted, and, during the fall of the input voltage (40, 5), drives the components (27, 31, 43, 44) such that the switching inputs (41) are conductively connected to the switching outputs (21), and the conductive connection between the switching inputs (22) and the switching outputs (21) is interrupted, and, by means of a suitable signal of the control input (36) of the control device (33), the components (25, 29, 43, 44) are driven such that the conductive connections between switching inputs (20, 41) and the switching output (21) are interrupted, and the components (27, 31) are driven such that a conductive connection is produced between the switching inputs (22) and switching outputs (21).

36. The circuit arrangement as claimed in claim 33, characterized in that the control device (33), during the rise of the input voltage (4, 5), drives the components (25, 27, 29, 31) such that the switching inputs (20) are conductively connected to the switching outputs (21) when the voltage measured at them is virtually zero, and the conductive connection between the switching inputs (22) and the switching outputs (21) is interrupted, and, during the rise of the input voltage (40, 5), drives the components (27, 31, 43, 44) such that the switching inputs (41) are conductively connected to the switching outputs (21) when the voltage measured at them is virtually zero, and the conductive connection between the switching inputs (22) and the switching outputs (21) is interrupted, and, by means of a suitable signal at the control input (36) of the control device (33), the components (25, 29, 43, 44) are driven such that the conductive connections between switching inputs (20, 41) and the switching output (21) are interrupted, and the components (27, 31) are then driven such that a conductive connection is produced between the switching outputs (21) if the voltage measured at them is virtually zero.

37. The circuit arrangement as claimed in claim 33, characterized in that the control device (33), during the fall of the input voltage (4, 5), drives the components (25, 27, 29, 31) such that the switching inputs (20) are conductively connected to the switching outputs (21) when the voltage at them is virtually zero, and the conductive connection between the switching inputs (22) and the switching outputs (21) is interrupted, and, during the fall of the input voltage (40, 5), drives the components (27, 31, 43, 44) such that the switching inputs (41) are conductively connected to the switching outputs (21) when the voltage at them is virtually zero, and the conductive connection between the switching inputs (22) and the switching outputs (21) is interrupted, and, by means of a suitable signal at the control input (36) of the control device (33), the components (24, 29, 43, 44) are driven such that the conductive connections between switching inputs (20, 41) and the switching output (21) are interrupted, and the components (27, 31) are then driven such that a conductive connection is produced between the switching inputs (22) and switching outputs (21) if the voltage measured at them is virtually zero.

38. The circuit arrangement as claimed in claim 28, characterized in that the input point (50) is connected by a further series path (51) to the switching inputs (22) of the switching elements (11, 12) and to the input (35) of the control device (33).

39. The circuit arrangement as claimed in claim 38, characterized in that the control device (33), by means of a suitable signal at its control input (36), is switched to state 1 during the first half-cycle of the input voltage at the input points (4, 50) and to state 2 during the second half-cycle of the input voltage, and the respectively existing state 1 or 2 is maintained during the zero crossing of the input voltage.

40. The circuit arrangement as claimed in claim 17, characterized in that there is connected between input point (4) and a further input point (50) a voltage source having alternating polarity, such as, for example, the secondary winding of a transformer, which has an additional tapping for voltage division, such as, for example, a center tap of the secondary winding of the transformer, and said additional tapping is connected to the input point (5) of the circuit arrangement as claimed in the invention.

41. The circuit arrangement as claimed in claim 17, characterized in that the control device (33) is embodied as an integrated circuit.

42. The circuit arrangement as claimed in claim 17, characterized in that the control device (33) is embodied as an electronic assembly.

43. The circuit arrangement as claimed in claim 17, characterized in that the control device (33) is embodied as a potted module.

44. The circuit arrangement as claimed in claim 17, characterized in that the control device (33) together with the controllable components (25, 27, 29, 31, 43, 44) is embodied as an integrated circuit.

45. The circuit arrangement as claimed in claim 17, characterized in that the control device (33) together with the controllable components (25, 27, 29, 31, 43, 44) is embodied as an electronic assembly, hybrid circuit, thick-film circuit or thin-film circuit.

46. The circuit arrangement as claimed in claim 17, characterized in that the control device (33) together with the controllable components (25, 27, 29, 31, 43, 44) is embodied as a potted module or module encapsulated by a housing.

* * * * *